United States Patent [19]
Segelken et al.

[11] Patent Number: 5,619,719
[45] Date of Patent: Apr. 8, 1997

[54] REDUCED INTER-MODULE CIRCUIT PATH CROSSOVERS ON CIRCUIT BOARDS MOUNTING PLURAL MULTI-CHIP MODULES, THROUGH REARRANGING THE NORTH-SOUTH-EAST-WEST INTERCONNECTION INTERFACES OF A GIVEN MODULE AND THROUGH SELECTIVE ROTATION OF EACH MODULE

[75] Inventors: John M. Segelken, Morristown; Richard R. Shively, Convent Station, both of N.J.; Christopher A. Stanziola, Staatsburg, N.Y.; Lesley J.-Y. Wu, Mountain Lakes, N.J.

[73] Assignee: Lucent Technologies Inc., Murray Hill, N.J.

[21] Appl. No.: 678,141

[22] Filed: Jul. 11, 1996

Related U.S. Application Data

[63] Continuation of Ser. No. 293,005, Aug. 19, 1994, abandoned.

[51] Int. Cl.[6] .................................................. G06F 15/60
[52] U.S. Cl. .................... 395/800; 395/200.02; 364/488; 364/489; 364/490; 364/491; 364/DIG. 1
[58] Field of Search ........................... 395/200.02, 800; 364/488, 489, 490, 491

[56] References Cited

U.S. PATENT DOCUMENTS 5,295,082   3/1994   Chang et al. ........................ 364/490

OTHER PUBLICATIONS

Val et al., "3-D Interconnection for Ultra-Dense Multichip Modules", IEEE Oct. 1990, pp. 814–821.

*Primary Examiner*—Meng-Ai T. An
*Assistant Examiner*—Dzung C. Nguyen
*Attorney, Agent, or Firm*—Charles E. Graves; Martin I. Finston

[57] ABSTRACT

The number of circuit path crossover points on boards mounting plural connected multichip modules is substantially reduced over the number that would otherwise be required. For 4-sided modules and boards, the modules are arranged on the board in such a way that their interconnecting north-east-south-west ports are successively reordered to N-S-E-W. Additionally, further advantage in reducing crossover vias may be gained by combining the reordering with a phased rotation of the modules from their nominal congruent board position. For the 4-sided module, these expedients virtually eliminate crossover vias between the east and west ports. It also provides for all MCMs a ready common bus structure located at a common interior area of the mounting board, to which the E- and W-ports are oriented. The invention is applicable to a class of multi-sided, multi-chip modules on boards with a like number of sides.

4 Claims, 9 Drawing Sheets

REDUCED INTER-MODULE CIRCUIT PATH CROSSOVERS ON CIRCUIT BOARDS MOUNTING PLURAL MULTI-CHIP MODULES, THROUGH REARRANGING THE NORTH-SOUTH-EAST-WEST INTERCONNECTION INTERFACES OF A GIVEN MODULE AND THROUGH SELECTIVE ROTATION OF EACH MODULE

GOVERNMENT CONTRACT

The government has rights in this invention pursuant to Contract No. N66604-89-C-6967 awarded by the Department of the Navy.

This application is a continuation of application Ser. No. 08/293005, filed on Aug. 19, 1994, now abandoned.

FIELD OF THE INVENTION

This invention relates to multiprocessor computers and particularly to arrangements for reducing routing path complexity among processor elements in a stacked multiprocessor board array.

BACKGROUND OF THE INVENTION

One form of multiprocessor computer architecture consists of stacked multiple printed circuit boards, each board containing several computing nodes. When a computing node includes multiple chips for performing processing, memory, communications and other functions as needed, the node may be referred to as a "multi-chip module," or "MCM."

Typically, although not necessarily, an MCM is formed with a surface geometry of a rectangle or, more usually, a square. The choice of a square surface geometry is influenced by conventional design, fabrication and MCM interconnection technology. In this typical configuration, each of the four edges of each MCM serve as a port, where a multiplicity of signal wires to and from the MCM are routed. The ports typically are denoted north, east, west and south. The ports physically are a linear array of contact pads disposed along the MCM edge, to a density typically of 125 pads per running inch.

One way to realize useful arrays of MCMs is to mount, for example, four square-shaped MCMs on an individual 4-sided metal core board. In addition to providing a mounting substrate for the MCMs, the metal core board provides linear fields of contact pads corresponding to the contact pads along the four sides of the MCM, and electrical connections, selectively as needed, between the MCM contact pads and the board contact pads. The latter contact pads provide the means for connecting the MCM ports on each board to the "outside world," including the MCMs located on boards at other layers in the stack, and a Host computer.

A preferred approach for stacking and electrically connecting the boards of a stacked array is described, for example, in the earlier patent application of the present Applicants, Ser. No. 07/590246, filed Sep. 28, 1990, and assigned to Applicant's assignees.

The complexities of the computer architecture formed by the MCMs in the stacked board arrays require a very large number of necessary signal paths. These signal paths are formed and routed on the MCMs themselves, as well as between MCMs on the same board level and MCMs which are located on boards disposed at other levels in the stack.

Large numbers of signal paths greatly increase the incidences of path "crossover" points. Crossover points occur both within the MCM and on the metal core board. Since the paths at cross-over points must not electrically contact one another, board and MCM design strategies must be used to prevent interfering electrical contact between crossing paths.

The typical expedient is to re-route one of the paths to a different layer and thus "cross over" the first path in a different plane. This approach requires "vias," or vertical interconnections fashioned as plated-through holes; lased vias (sometimes termed "microwire") or microvias. These interconnections join the upper and the lower level of the circuit, wherein one of the interfering circuit paths is connected to the top end of the via. The path is continued through to the bottom end of the via, where a connection is made to a continuation path formed on the underside of the device, substrate or the board, as the case may be.

Vias on the mounting board, however, detract from the very limited surface area needed for running circuit paths. Vias also add more detail to the board. Thus, an excess of vias creates increased board size and/or number of layers; and adds substantially to production costs. When vias are implemented as plated-through holes, they increase total area requirements because of the added land area and clearance area required; and also can decrease board yield. The vias here also reduce the heat dissipation of the board by detracting from the metalization layer.

The efficient routing of signals in the stacked board configuration such as is described in the noted patent application, therefore has been difficult to achieve because of the lack of a way to minimize the number of vias on the metal core board.

OBJECTS OF THE INVENTION

One object of the invention is to improve the routing of signals in stacked-board multiprocessor configurations.

A specific object of the invention is to reduce the routing path crossovers in such arrays, as well as the complexities that accompany the including of via routing paths.

A further object of the invention is to take advantage of the inherent geometry of current stacked-board multiprocessor configurations to reduce the number of signal routing crossovers while at the same time reducing the length of the routing paths.

SUMMARY OF THE INVENTION

The invention originates in part from a realization that the routing densities achievable on the MCM are both higher and more cost-effective than can be achieved on the metal core mounting board. Additionally, less parasitic capacitance is created by locating routing paths, where possible, on the MCM. Therefore, the placement of routing circuitry may be both concentrated advantageously on the MCMs, and also configured advantageously at the MCM contact pads.

Proceeding from this realization, the invention in its broadest sense then involves reducing the number of circuit path crossover points that would otherwise be required on the mounting board. This is achieved by mounting the MCMs on the board in such a way that their north-east-south-west ports are successively reordered to N-S-E-W. The reordering places the ports out of their normal N-E-S-W orientation practiced in the prior art; and provides for all MCMs a common bus structure located at a common interior area of the mounting board, to which the E- and W-ports are oriented. In the new orientation, the N- and S-ports are disposed in different planes, for example, the N-port is above-board and the S-port is below board. The E- and W-ports are on the same board or plane.

In one illustrative embodiment of the invention, four square-shaped MCMs are mounted on a metal core board with the aforementioned reordered port orientation, achieved by rearranging the internal circuitry in each individual MCM. Additionally, the MCMs are rotated relative to each other by increments of 90)de. This helps reduce the number of crossovers on the metal core board. The specific rearrangements continue to follow a basic convention of connecting N to S, and E to W, while, pursuant to the invention, the number of crossovers needed to be formed external to the MCMs on their mounting board are reduced or in some instances eliminated altogether.

The inventive concept is applicable beyond an assembly of a set of four 4-sided MCMs on a mounting board used in the example. The invention will be seen to be applicable to a definable class of multi-sided multi-chip modules on a board, wherein crossover points can be minimized through rotation of the MCMs and reordering of the orientation of the ports of the MCMs. Further, the invention is applicable to 4-sided MCMs which are designed to have, for example, eight ports with two ports disposed on each edge.

DETAILED DESCRIPTION OF ILLUSTRATIVE EMBODIMENTS

Figure 1:
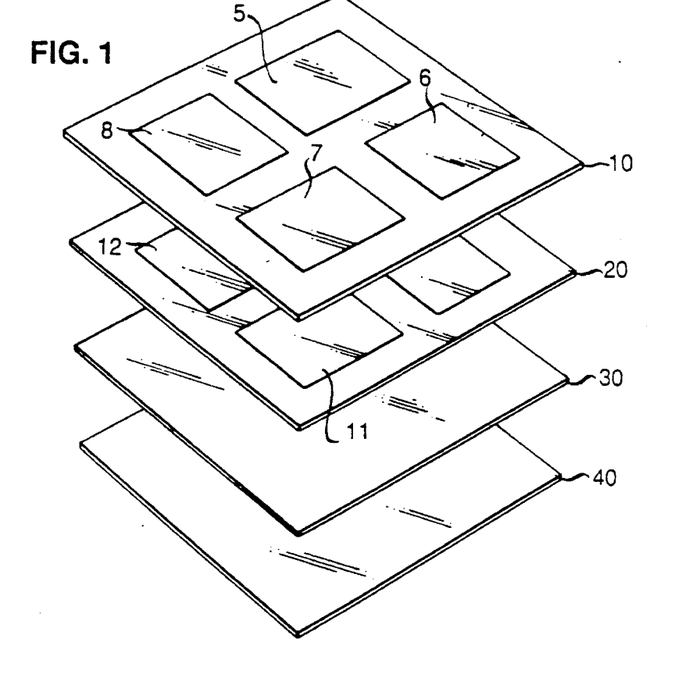
FIG. 1 is an exploded schematic perspective diagram of a typical stack of board-mounted MCMs.

FIG. 1 shows schematically a stack of metal core boards denoted 10, 20, 30, 40, arrayed in exploded view for illustration. On each board are mounted four multi-chip modules (as above, "MCMs"), these being denoted 5, 6, 7, 8 for the board 10. The boards 20, 30, and 40 also each have MCMs mounted as on board 10, such as the MCMs denoted 11 and 12 on board 20. For simplicity the MCMs associated with the boards 30, 40 are not shown in FIG. 1. Further structural details of the boards 10, 20, 30, 40, and MCMs 5–8, and of the stacking assembly, are contained in the above-cited patent application Ser. No. 07/590246. The board 10 is metal cored to extract heat, by conduction to an outer perimeter region where convective heat transfer occurs as taught, for example, in the patent application of Y. C. Lee and J. M. Segelken, Ser. No. 07/387480, filed Jul. 28, 1989, and assigned to Applicants' assignee. This patent application to the extent relevant is incorporated by reference.

Figure 2:
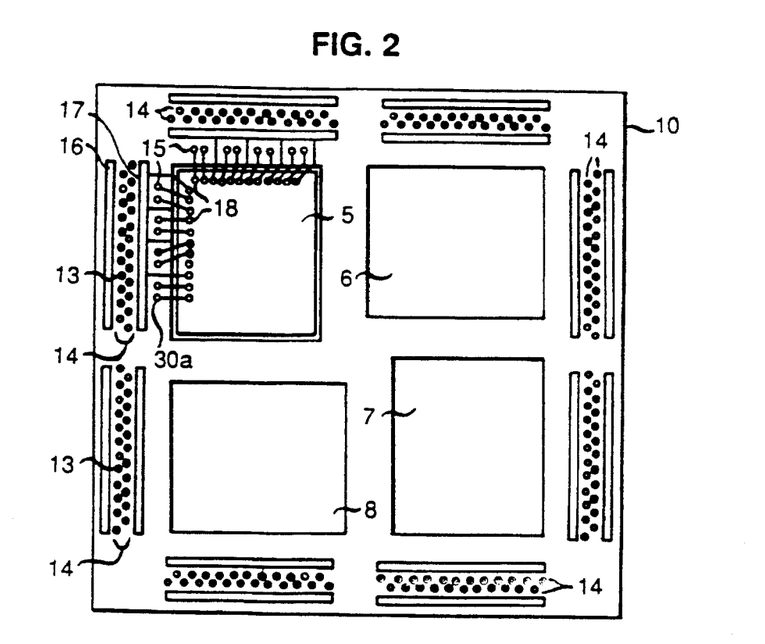
FIG. 2 is a top view of a board mounting MCMs.

Referring to FIG. 2, contact pads formed on board 10, such as pad 13, are arrayed in fields denoted 14. The regions 16, 17 denote conventional surface metalization explained in the cited patent application Ser. No. 07/590246. On the board 10, adjacent to each of the four outwardly-facing sides of each MCM 5, 6, 7, 8 are formed MCM connect pads 15. Wire bonds connect from contacts 18 on the MCMs to contacts 15 on board 10.

Figure 3:
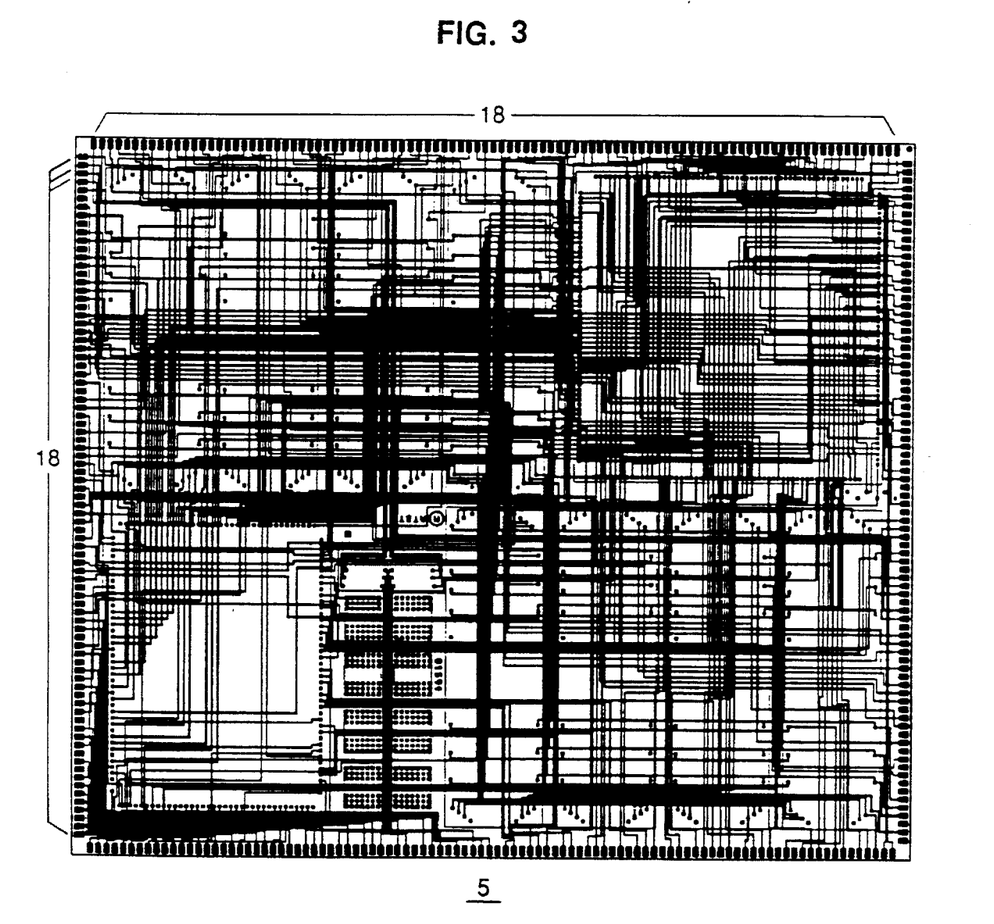
FIG. 3 is a partial copy of several superposed masks of the routing connections on a typical MCM.

As noted earlier, circuit path crossover points have presented problems in the structures illustrated in FIGS. 1 and 2. Specifically, the routing paths which culminate in contacts 18, best seen in FIG. 3, which provide connection to and from the MCMs 5, 6, 7, 8, must ultimately connect to the "outside world," such as to a Host computer or other instrumentality. The contacts 18 are located along each of the four sides of the MCM 5. FIG. 3 is provided to show the very large number of connections needed to the outside world from the internal circuitry of the MCM 5. Each of the contacts 18 detailed in FIG. 3, must be connected by a path to the outside world. FIG. 3 also is a specific example of the routing density achievable on the MCM.

Figure 4:
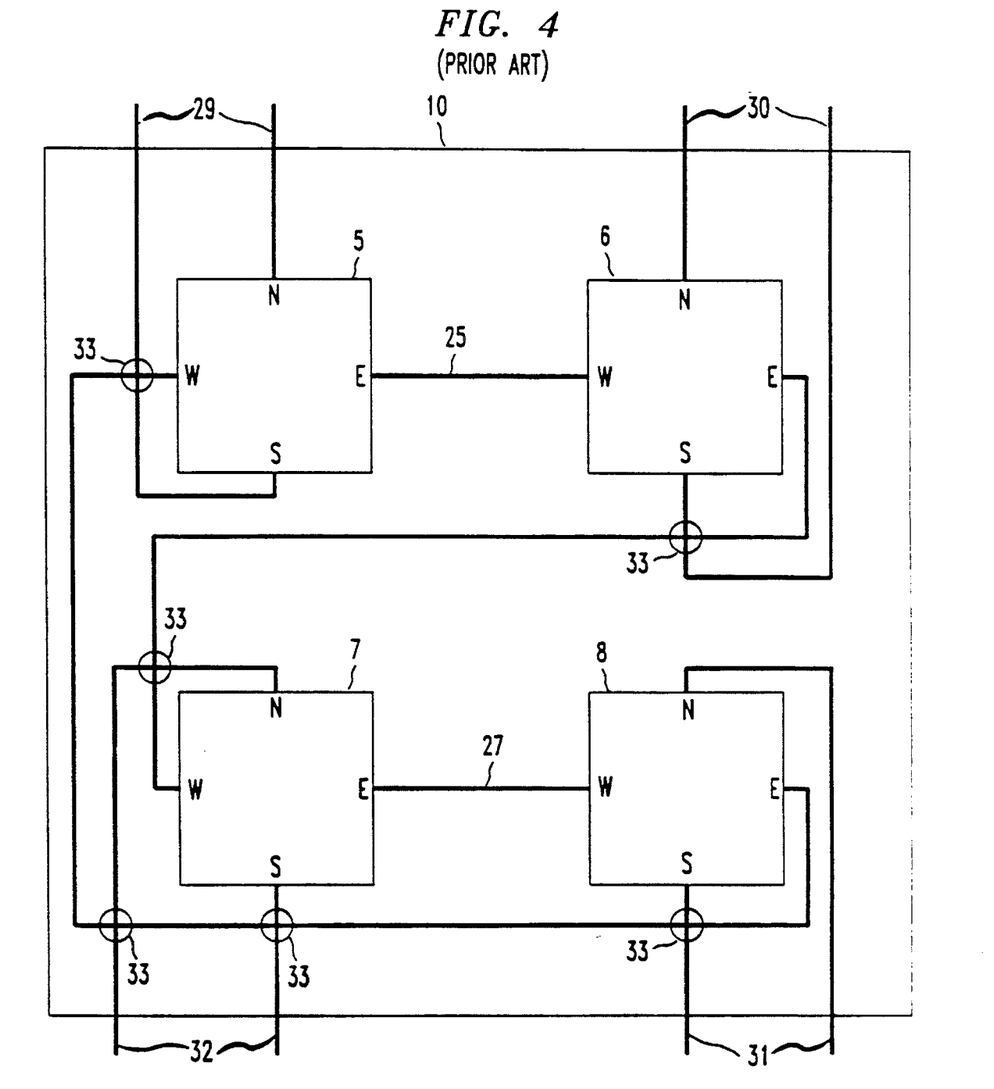
FIGS. 4 and 5 are schematic top views of prior art board-MCM wiring plans, showing crossover areas.

FIG. 4 is a first simplified sketch showing of the character of the prior art crossover problem. In contrast to FIG. 3, in FIG. 4, only one circuit path instead of 100 (for example) is actually shown which connects the "north, east, south and west" ports or sides of four MCMs mounted on a board. In this example, it will be noted that the sequence of MCMs, starting clockwise from the top left is: MCMs 5, 6, 8, 7; and further, for each said MCM, the port configuration is the conventional N-E-S-W. In this configuration, the N- and S-ports are connected to other boards in the manner shown, for example, in FIG. 8, wherein the N-port is disposed on the top surface of board 10, and the S-port is routed to the bottom surface of the board beneath the corresponding N-port. The nomenclature used in FIG. 4 is adapted from FIGS. 1 and 2, wherein the MCMs are denoted 5, 6, 7, 8 and their board is denoted 10. For illustration, the connections among the ports N, E, S, W of the respective MCMs are those needed to configure a torus architecture which is more fully described in the cited patent application Ser. No. 07/590246. The convention of connecting N to S, and E to W, is shown.

Specifically in FIG. 4, paths 25, 26, 27 and 28 achieve the E to W connections; and paths 29, 30, 31, and 32 achieve the N to S connections which, as noted, go to adjacent boards in the stack. Paths 29N, 30N, 31N, and 32N are on the board top surface and connect to the S-ports in the next-higher board (see FIG. 8).

It will be noted that the preceding connections are effected by circuit paths contained on board 10 as opposed to their being contained on the MCMs 5, 6, 7, 8. The connections require that crossover vias, schematically indicated by the encircled area 33, be provided where the E- or W-paths intersect the N- or S-paths. Six such areas 33 are shown in the illustration, all requiring crossover vias.

In connection with FIG. 4, it will be appreciated that the number of crossover vias necessary at position 33 is not simply the one exemplified, but rather number up to 100, one for each active one of the contracts 18.

Figure 5:
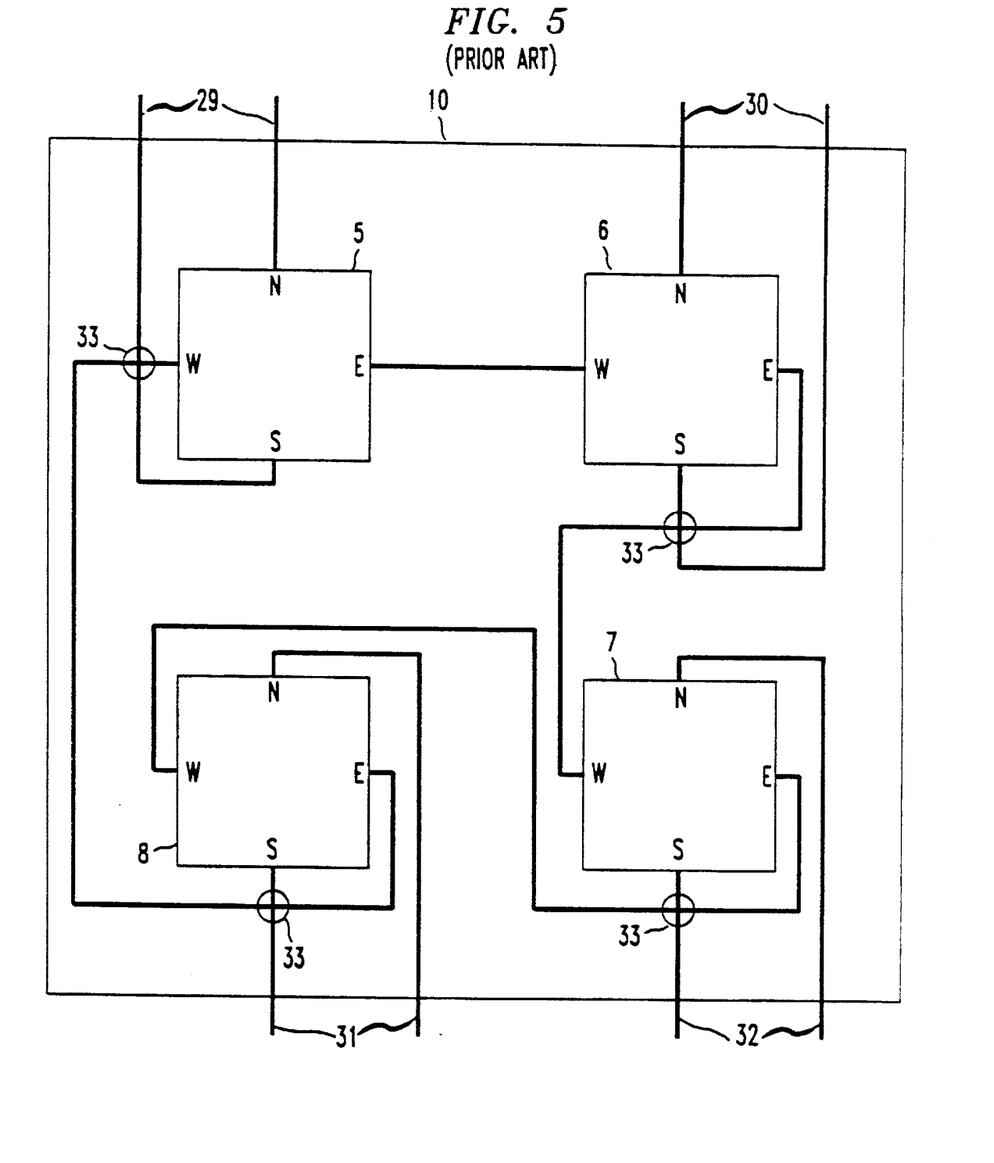

FIG. 5 is another simplified sketch showing a further example of the conventional crossover problem encountered in the prior art. FIG. 5 is similar in configuration to FIG. 4, except that the locations of the MCMs starting at the top and going clockwise, is: 5, 6, 7, 8. The change does reduce the number of crossover areas to four, from the six noted in FIG. 4; but four areas are still far too many.

The invention will now be illustrated by reference to FIG. 6, in which the ports of the MCMs 5, 6, 7, 8 are reordered and a 90](de phased rotation of the individual MCMs is effected. Specifically, E- and W-ports of the individual MCMs are re-routed as necessary within the MCMs, resulting in the E- and W-ports facing inwardly and toward each other. As with the configuration of FIG. 4, the E-W port connections 5E-6W, 6E-7W, 7E-8W and 8E-5W are maintained by the respective paths 37, 38, 39, 40. In accordance with the invention, however, it is seen that there are now no crossovers of any of the N-S or E-W paths 37-40. It will also be noted that the E-W paths achieved pursuant to the invention are more direct and therefore shorter than in the prior art boards of FIGS. 4 and 5.

In consequence of the invention, the bus structure which accesses the MCM board stack for communications and command signals can be improved. Specifically, for the computer architecture achieved by the herein-described basic 4-sided board 10 which mounts four square or rectangular-shaped MCMs each with N, E, S, W ports, further advantage may be taken of the invention when adding essential common busses on the MCMs.

As is known to persons skilled in the art of multiprocessor computer configurations, it is necessary for the Host computer to be able to communicate directly and essentially simultaneously with each of many computing nodes. This is accomplished advantageously by providing communications channel from the Host to all nodes, which channel is separate from the N-S and E-W internode connections described above. The communications channels are used to download signal pattern data, processing instructions and reporting instructions to the individual nodes.

Figure 7:
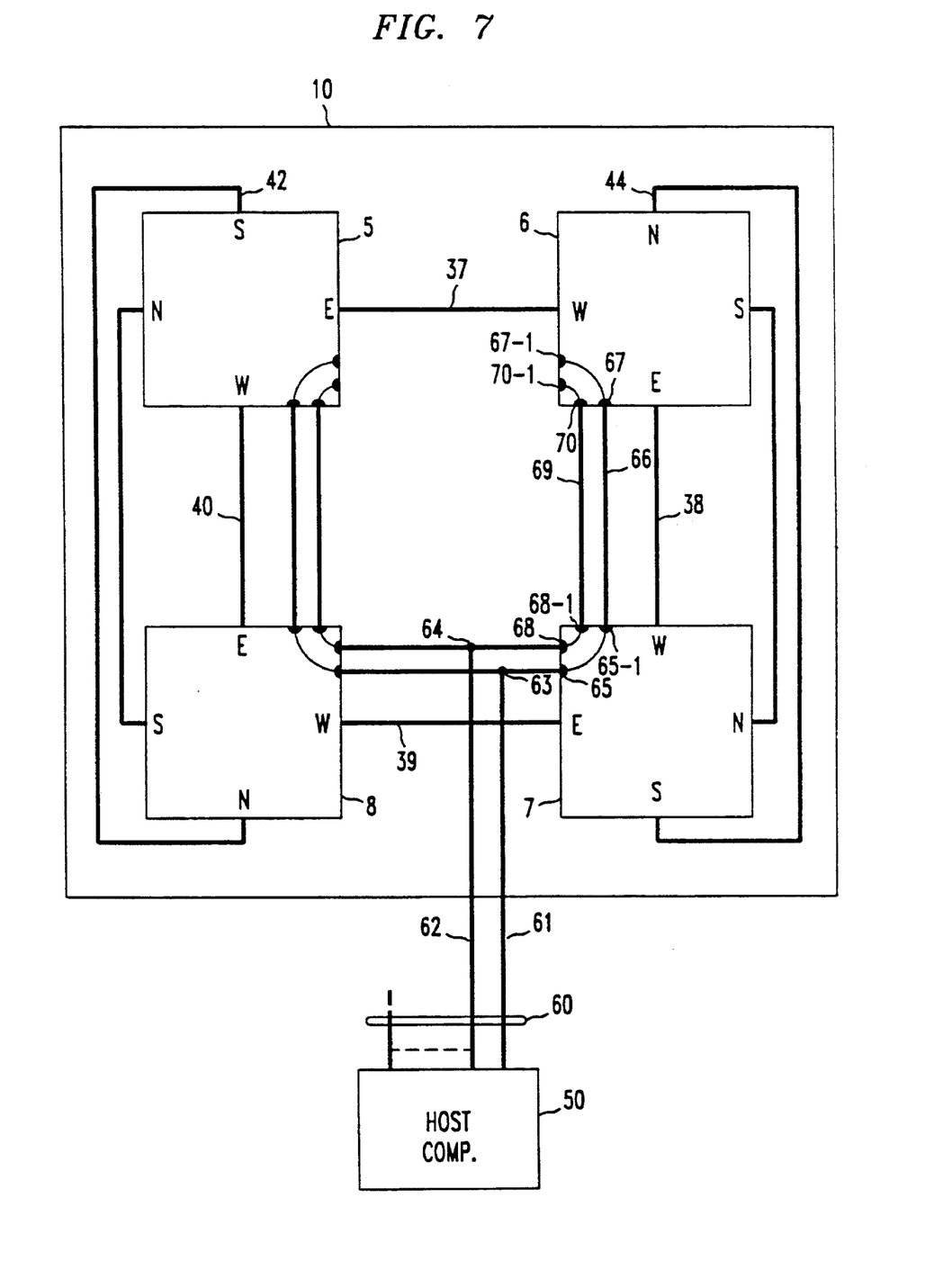
FIG. 7 is a schematic top view of a board embodying the invention of FIG. 6, showing further routing innovations.

The Host communications connections to the MCMs are advantageously placed at the interior-facing corners of a 4-MCM structure as illustrated in FIG. 7. The question of how best to bring each communications path from the "outside world" represented by Host computer 50, to the boards such as board 10, and thence to these interior corners of the MCMs 5, 6, 7, 8 is next addressed.

Figure 6:
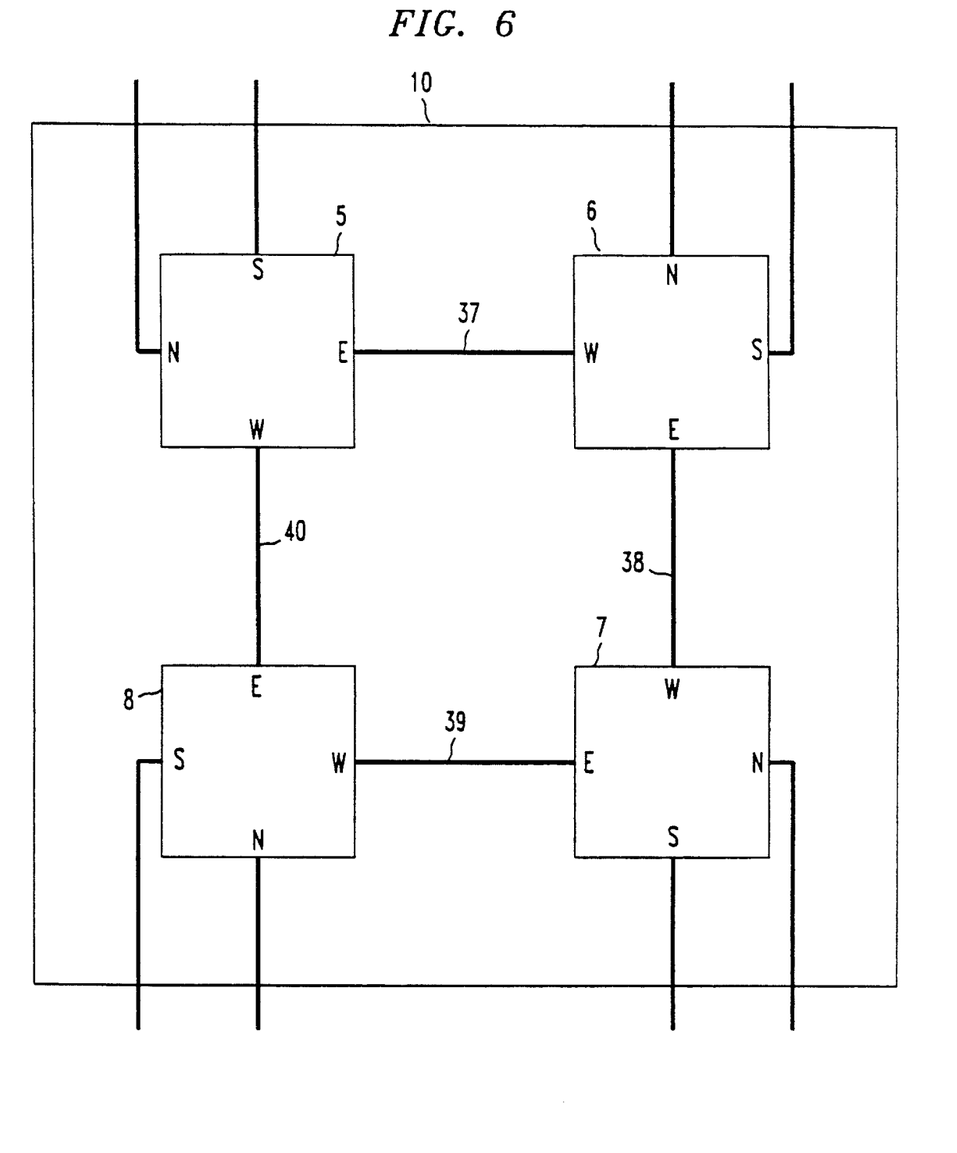
FIG. 6 is a schematic top view of a board-MCM wiring plan using the invention.

FIG. 7 illustrates an efficient way to add communications busses to the structure depicted in FIG. 6. The group 60 of communications paths from Host computer 50 includes paths 61 and 62 for illustration. These paths serve the MCMs of board 10, it being understood that in reality ten or twenty communications paths may be needed to serve board 10.

Like the MCM port connections, the communications paths 61, 62 must be routed into board 10 so as to avoid creating crossover points as much as possible. Pursuant to this aspect of the invention, the paths 61, 62 are continued onto board 10 on the underside thereof, as illustrated by the dotted lines in FIG. 7, thereby crossing under the path 39 between ports 7E-8W. Paths 61, 62 thereafter are connected to two vias, 63, 64. It will be seen shortly that just one via is needed to bring each path such as path 61 to communications contact pads at the corners of the MCMs 5, 6, 7, 8.

Path 61 connects through via 63 to the top side of board 10, and then continues on to connect to pad 65 on MCM 7. An internal path in MCM 7 is provided from pad 65 on the east port to a "duplicate" pad 65-1 on the west port. A connecting path 66 is made on board 10 from pad 65-1 to pad 67 at the east port of MCM 6; and an internal connection is made from pad 67 to a duplicate pad 67-1 on the west port of MCM 6. It will be noted that, due in substantial part to the connections made internally in the MCMs, no path crossovers are necessary.

Path 62 connects through via 64 to the top side of board 10, and then continues on to connect to pad 68 on MCM 7. Another internal connection in MCM 7 is provided from pad 68 to pad 68-1 on the west port. A connecting path 69 is provided from pad 68-1 to pad 70 on the east port of MCM 6. An internal connection is made from pad 70 to a duplicate pad 70-1 on the west port of MCM 6. Again, no path crossovers are created because the paths 66 and 69 do not interfere with each other, nor with the inter-MCM path 38.

The practitioner can readily appreciate that in a similar fashion, the paths 61, 62 are extended to communications contact pads shown (but not numbered) on MCMs 8 and 5. Again it is seen by reference to FIG. 7 that no crossover points are created with these extensions.

Figure 8:
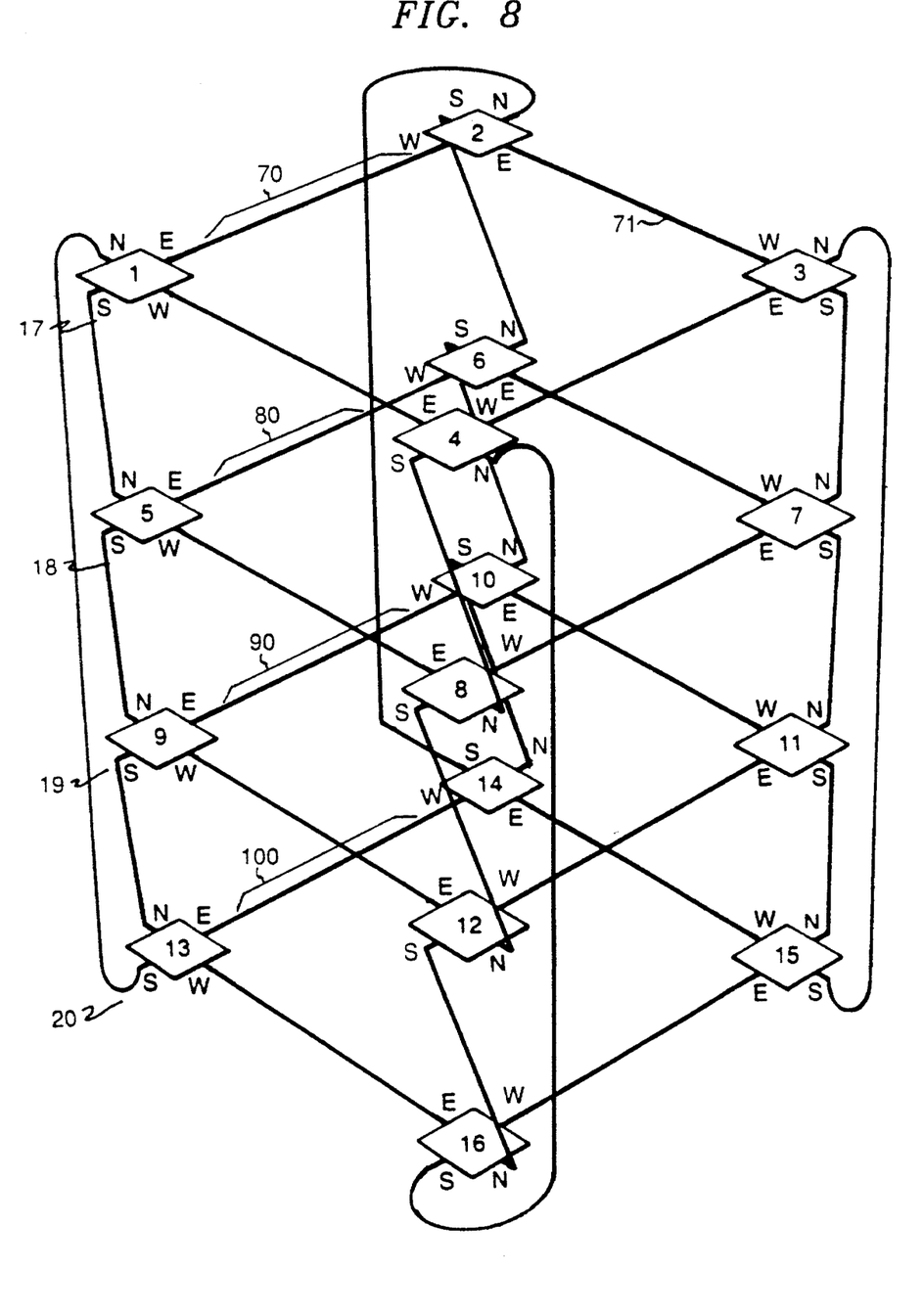
FIG. 8 is a schematic perspective diagram of the invention applied to a multilayer stack of boards.

FIG. 8 illustrates the application of the invention to a stacked array of boards. The configuration of connected MCMs shown in FIG. 8 is a Torus. MCMs denoted 1-1, 2-1, 3-1, 4-1 are mounted on a board 70 which is shown only in partial phantom view for clarity. Board 70 is similar to board 10 seen in FIG. 5. Similarly, MCMs 5-1, 6-1, 7-1, 8-1 are mounted on a board indicated as 80; MCMs 9-1, 10-1, 11-1, 12-1 are mounted on a board indicated as 90; and MCMs 13-1, 14-1, 15-1, 16-1 are mounted on a board indicated as 100. Each of the MCMs have ports designated N, E, S, W.

FIG. 8 illustrates that the convention of connecting E-ports to W-ports, and N-ports to S-ports, is maintained. At the same time, crossovers in connecting E-W ports of adjacent MCMs are avoided. Thus, for example, the E-port of MCM 2-1 connects directly via circuit path 71 to the W-port of MCM 3-1. All of the remaining three connections of E-to-W ports on board 10 likewise are connected without occasioning crossovers. Further, the E-W port connections of the four MCMs on each of the respective boards 80, 90, 100, are connected without requiring crossovers. The avoidance of crossovers is achieved pursuant to the invention, by reordering and rotating the ports of respective adjacent MCMs on each board so that all E- and W-ports face inwardly toward a common central board sub-area, and each E-port is directly facing a corresponding W-port.

The convention of connecting N-to-S ports likewise is maintained in the assembly shown in FIG. 8. Methods for specifically effecting these N-S connections are contained in the cited patent application Ser. No. 07/590246.

Figure 9:
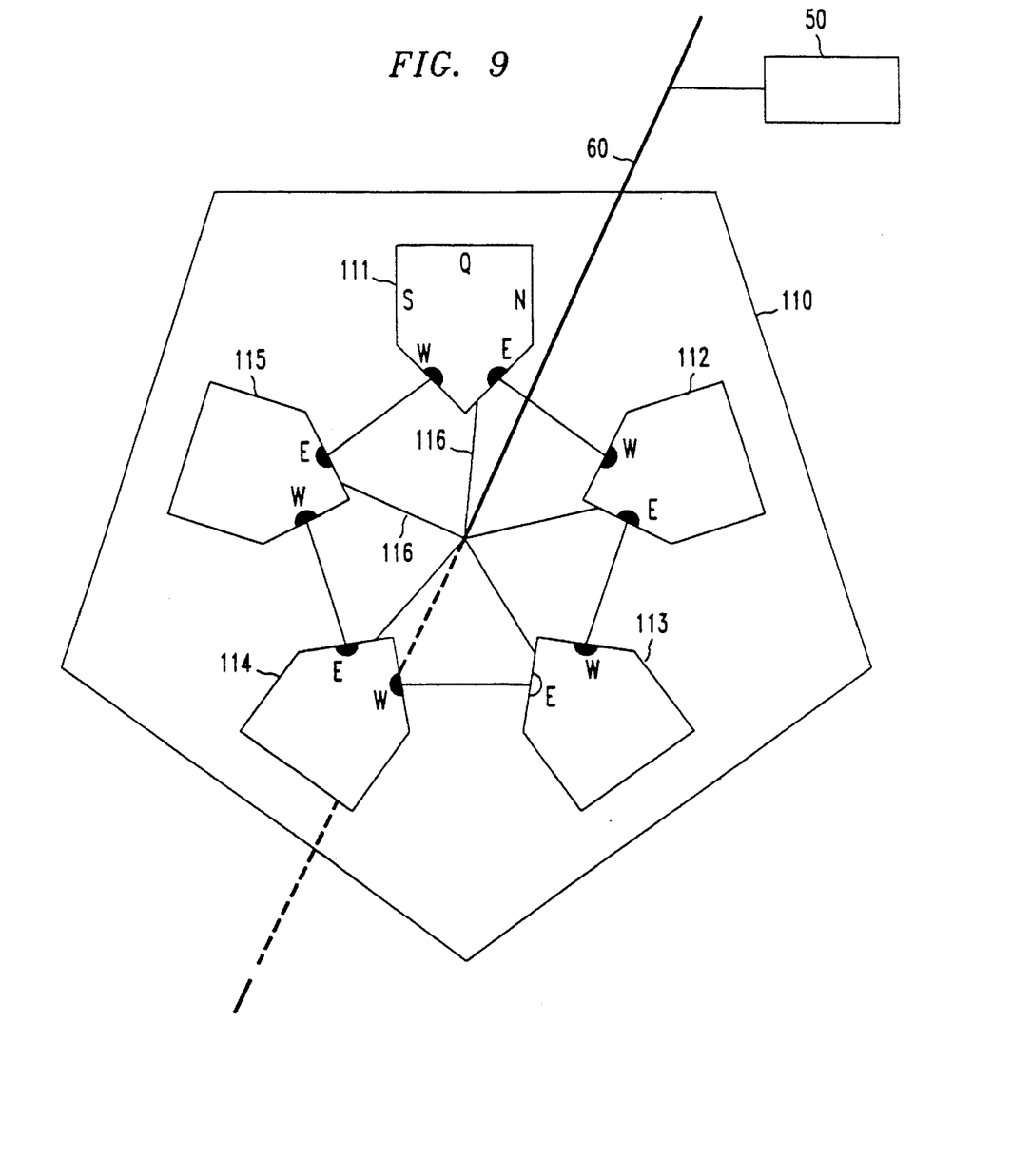
FIG. 9 is a perspective view depicting an alternative form of board and MCM to which the invention is applicable.

FIG. 9 shows that the invention may be applied to board-MCM configurations other than having four 4-ported MCMs mounted on a 4-sided board. As seen in FIG. 9, a 5-sidedboard 110 mounts five MCMs 111, 112, 113, 114, 115, each of which are 5-ported. For example, MCM 111 included ports E, W, N, S and Q. Ports N, S and Q may be connected in various configurations; but importantly, it is seen that ports E and W are connected, in accordance with the invention, so that all E- and W-ports face inwardly toward a common central board sub-area, and each E-port is directly facing a corresponding W-port. FIG. 9 also illustrates that a communications path 60 from a Host computer can be introduced in a vertical run to a center location of board 110, from which communications links 116 are placed to pads 117 on each of the MCMs 111–115.

The embodiment of FIG. 9 depicts a 5-sided MCM and a 5-sided board mounting five such MCMs. It is apparent, however, that the same basic scheme of inwardly-facing E-W ports accessed by a common bus and communicating through direct E-W connections not requiring crossovers, can be achieved for a 6-sided MCM and 6-sided mounting boards. In general, an n-sided MCM and an n-sided board mounting n MCMs, where n is 4 or more, is contemplated within the scope of the invention.

Figure 10:
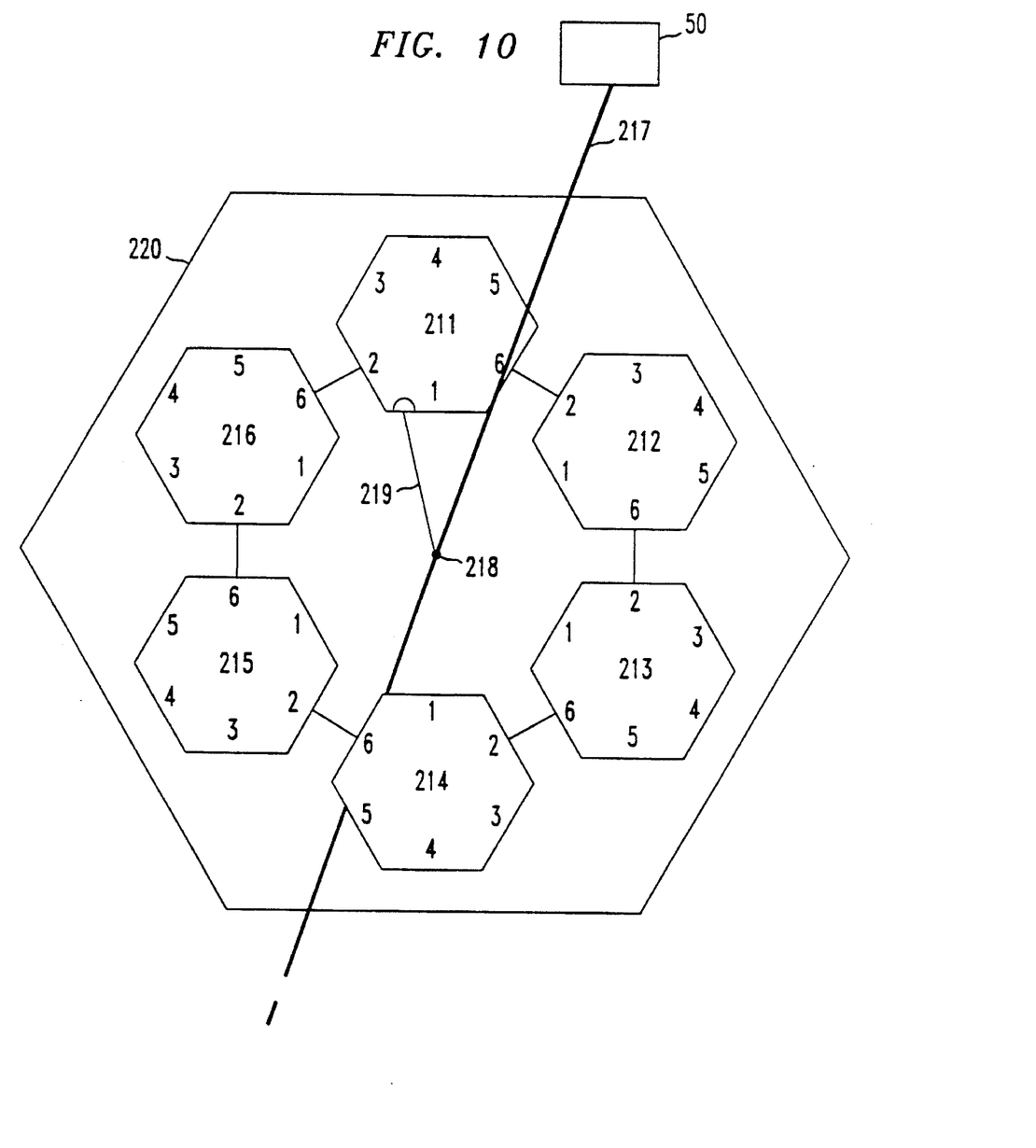
FIG. 10 is a perspective view of a further alternative shape of MCM.

FIG. 10 shows a further configuration of MCMs, this time produced by six congruent regular hexagonal MCMs denoted 211, 212, 213, 214, 215, 216. The MCMs are mounted on a board 220. Each MCM has ports designated 1, 2, 3, 4, 5, 6. A communications link 216 from a Host computer 50 connects at a point 218 essentially in the center of the common area in a path which is run generally vertically to the board 220. A bus path 219 is provided either directly from area 218, or in paths that are parallel to the 2-to-6 port linkage path. Several boards 220 with MCMs may be stacked and so linked.

In accordance with the invention, each successive MCM is mounted on the board in an orientation that is rotated or phased by 60 degrees relative to either of its neighbors. In this configuration, the 1-ports of the MCMs always face inwardly and toward a central common area. The 2- and 6-ports always face each other, providing the constant E-W connection between adjacent MCMs of the type illustrated earlier. The 3-, 4-, and 5-ports always face outwardly. It also will be appreciated that the MCMs of FIG. 10 might be configured in a tight mosaic wherein the sides containing the ports 2 and 6 actually touch, to pack more MCMs into a given limited space on board 220.

We claim:

1. A computing device comprising a host computer and a plurality of computing nodes, each said node comprising an interconnected rectangular array of four circuit modules disposed on an upper surface of a circuit board, said board further having a lower surface, wherein:

a) each said circuit module comprises an interconnection interface situated on each of four respective edges;

b) with respect to a standard interconnection scheme, the interconnection interfaces on each module are respectively denoted. North (N), South (S), East (E), and West (W), and occur in the sequence NSEW upon a circumambulation of said module;

c) the modules are interconnected according to a standard interconnection scheme that calls for E to connect only to W and N only to S, permits E-W connections only within single circuit boards, and permits N-S connections within single circuit boards or to adjacent circuit boards;

d) each module within a rectangular array has a progressive 90-degree rotation relative to the preceding module within the array, whereby each edge bearing an E interconnection interface directly faces a W edge of an adjacent module, each corner formed by the E and W edges of a module faces inwardly relative to the rectangular array, and each corner formed by the N and S edges of a module faces outwardly relative to the rectangular array;

e) the host computer is connected to each computing node by way of a plurality of communication paths;

f) each communication path extends from the host computer to the lower surface of a respective circuit board and from there through a via to a connection point on an E-W interconnection path on the upper surface of said board; and g) all of said connection points within a given node are situated on interconnection paths between the same E edge and the same W edge.

2. The computing device of claim 1, wherein each circuit module includes a plurality of internal connection paths for routing host-computer communications between the E edge and the W edge of said module.

3. The computing device of claim 2, wherein:

each circuit module has a first plurality of E-W interconnection paths to a clockwise-adjacent module and a second plurality of E-W interconnection paths to a counterclockwise-adjacent module; and each of said internal connection paths connects a path of said first plurality to a path of said second plurality.

4. A computing device comprising a plurality of computing nodes, each said node comprising an interconnected rectangular array of four circuit modules disposed on an upper surface of a circuit board, wherein:

a) each said circuit module comprises an interconnection interface situated on each of four respective edges;

b) with respect to a standard interconnection scheme, the interconnection interfaces on each module are respectively denoted North (N), South (S), East (E), and West (W), and occur in the sequence NSEW upon a circumambulation of said module;

c) the modules are interconnected according to a standard interconnection scheme that calls for E to connect only to W and N only to S, permits E-W connections only within single circuit boards, and permits N-S connections within single circuit boards or to adjacent circuit boards;

d) each module within a rectangular array has a progressive 90-degree rotation relative to the preceding module within the array, whereby each edge bearing an E interconnection interface directly faces a W edge of an adjacent module, each corner formed by the E and W edges of a module faces inwardly relative to the rectangular array, and each corner formed by the N and S edges of a module faces outwardly relative to the rectangular array;

e) all of said nodes are congruent to each other, such that each module in any given node has a corresponding module in each of the other nodes;

f) the nodes are arranged in a stack having a top node, a bottom node, and at least one intermediate node;

g) each module within a given intermediate node is connected to the respective corresponding modules in the adjacent nodes thereabove and therebelow; and h) each module within the top node is connected to the corresponding module in the bottom node, such that a torus configuration is defined.

\* \* \* \* \*